United States Patent
Crawley et al.

(10) Patent No.: US 8,400,230 B2
(45) Date of Patent: Mar. 19, 2013

(54) FREQUENCY MODULATION OF CLOCKS FOR EMI REDUCTION

(75) Inventors: Philip John Crawley, Sacramento, CA (US); Kenneth William Taylor, Davis, CA (US)

(73) Assignee: Akros Silicon Inc., Folson, CA (US)

( * ) Notice: Subject to any disclaimer, the term of this patent is extended or adjusted under 35 U.S.C. 154(b) by 848 days.

(21) Appl. No.: 12/534,044

(22) Filed: Jul. 31, 2009

(65) Prior Publication Data

US 2011/0026655 A1    Feb. 3, 2011

(51) Int. Cl.
*H03C 3/00* (2006.01)
(52) U.S. Cl. ........... 332/117; 332/123; 331/78; 375/141
(58) Field of Classification Search .................. 332/123, 332/117; 331/78; 375/141
See application file for complete search history.

(56) References Cited

U.S. PATENT DOCUMENTS

| | | | |
|---|---|---|---|
| 4,975,820 A | 12/1990 | Szepesi | |
| 5,903,452 A | 5/1999 | Yang | |
| 7,233,215 B2 * | 6/2007 | Ebuchi et al. | 332/117 |
| 7,265,530 B1 | 9/2007 | Broach et al. | |
| 2006/0284607 A1 | 12/2006 | Isobe | |

* cited by examiner

*Primary Examiner* — Arnold Kinkead
(74) *Attorney, Agent, or Firm* — Ken J. Koestner

(57) ABSTRACT

In an electronic system, a frequency modulator manages clock signals for electromagnetic interference (EMI) reduction. The illustrative frequency modulator comprises a core oscillator, and a clock divider coupled to the core oscillator that modulates frequency of the core oscillator and deterministically spreads clock spectral components of a digital clock signal whereby electromagnetic interference (EMI) is reduced. The frequency modulator further comprises a circuit coupled to the clock divider that receives the digital clock signal, combines the digital clock signal with a data bitstream for transmission across an isolation barrier, and resynchronizes to the digital clock signal.

25 Claims, 13 Drawing Sheets

| (25 Mhz) | PRI DIV: | 3 | 4 | 5 | 6 |
|---|---|---|---|---|---|
| SEC DIV: | SEC (Hz) | PRI (Hz) | | | |
| 12 | 2.08M | N/A | 521k | 417k | 347k |
| 24 | 1.04M | 347k | 260k | 208k | 174k |
| 36 | 0.69M | 231k | 174k | 139k | 116k |
| 48 | 0.52M | 174k | 130k | 104k | N/A |

FIG. 1B

| RNDDLY | UP_MAX FREQ | DN_MAX FREQ | UP_PROP | DN_PROP | UP_MAX | DN_MAX | STEPS | IDEAL MAX FRQ JUMP |
|---|---|---|---|---|---|---|---|---|
| 3 | 25.00% | 50.00% | 15.79% | 14.29% | 81 | 74 | 309 | 0.12% |
| 6 | 14.29% | 20.00% | 31.58% | 28.57% | 162 | 147 | 617 | 0.03% |
| 9 | 10.00% | 12.50% | 47.37% | 42.86% | 243 | 220 | 925 | 0.01% |
| 12 | 7.69% | 9.09% | 63.16% | 57.14% | 324 | 293 | 1233 | 0.01% |

| | MD CLKS PER STEP | | | |
|---|---|---|---|---|
| | 3 | 4 | 5 | 6 |
| | 4 | 6 | 7 | 8 |
| | 2 | 3 | 4 | 4 |
| | 2 | 2 | 3 | 3 |
| | 1 | 2 | 2 | 2 |
| MOD%: | 0.97% | 0.86% | 0.92% | 0.97% |
| | 0.97% | 0.86% | 0.81% | 0.97% |
| | 0.65% | 0.86% | 0.72% | 0.86% |
| | 0.97% | 0.65% | 0.81% | 0.97% |

FIG. 2C

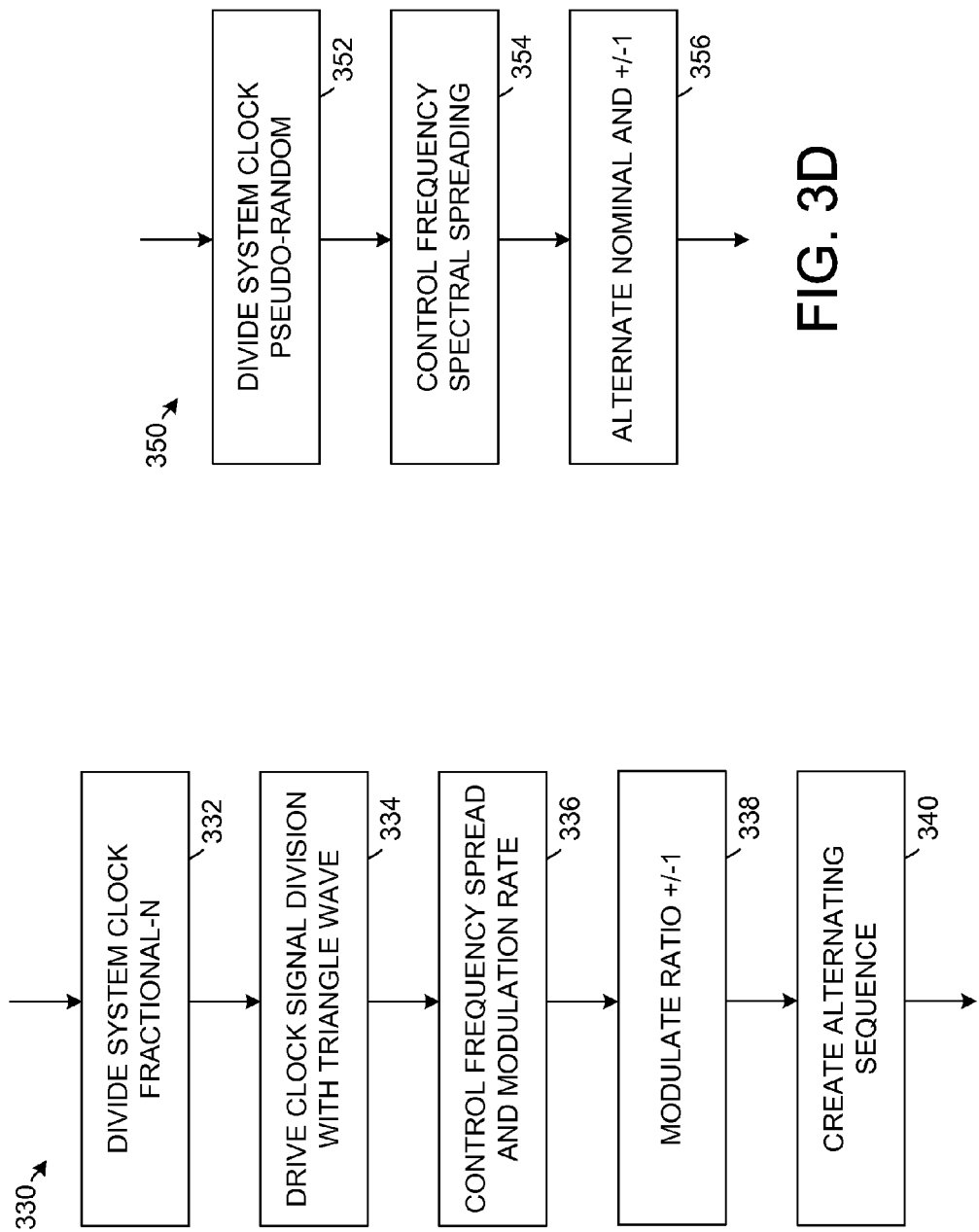

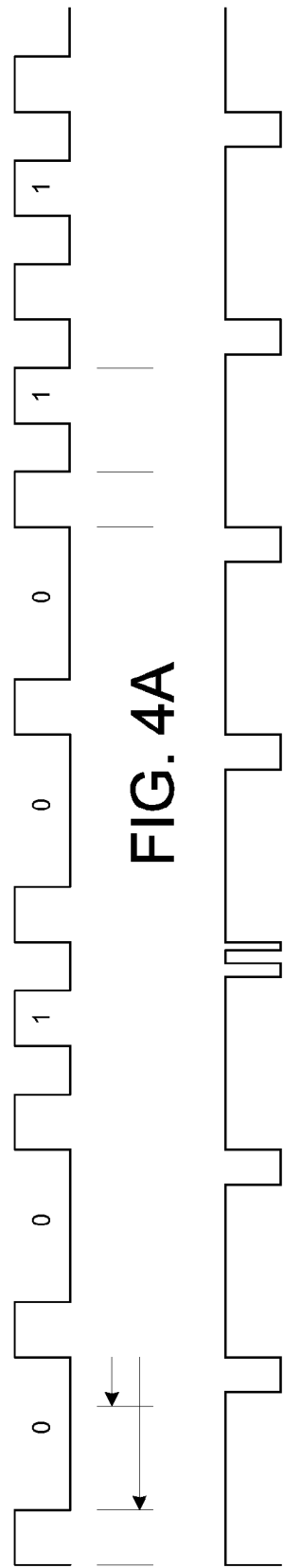

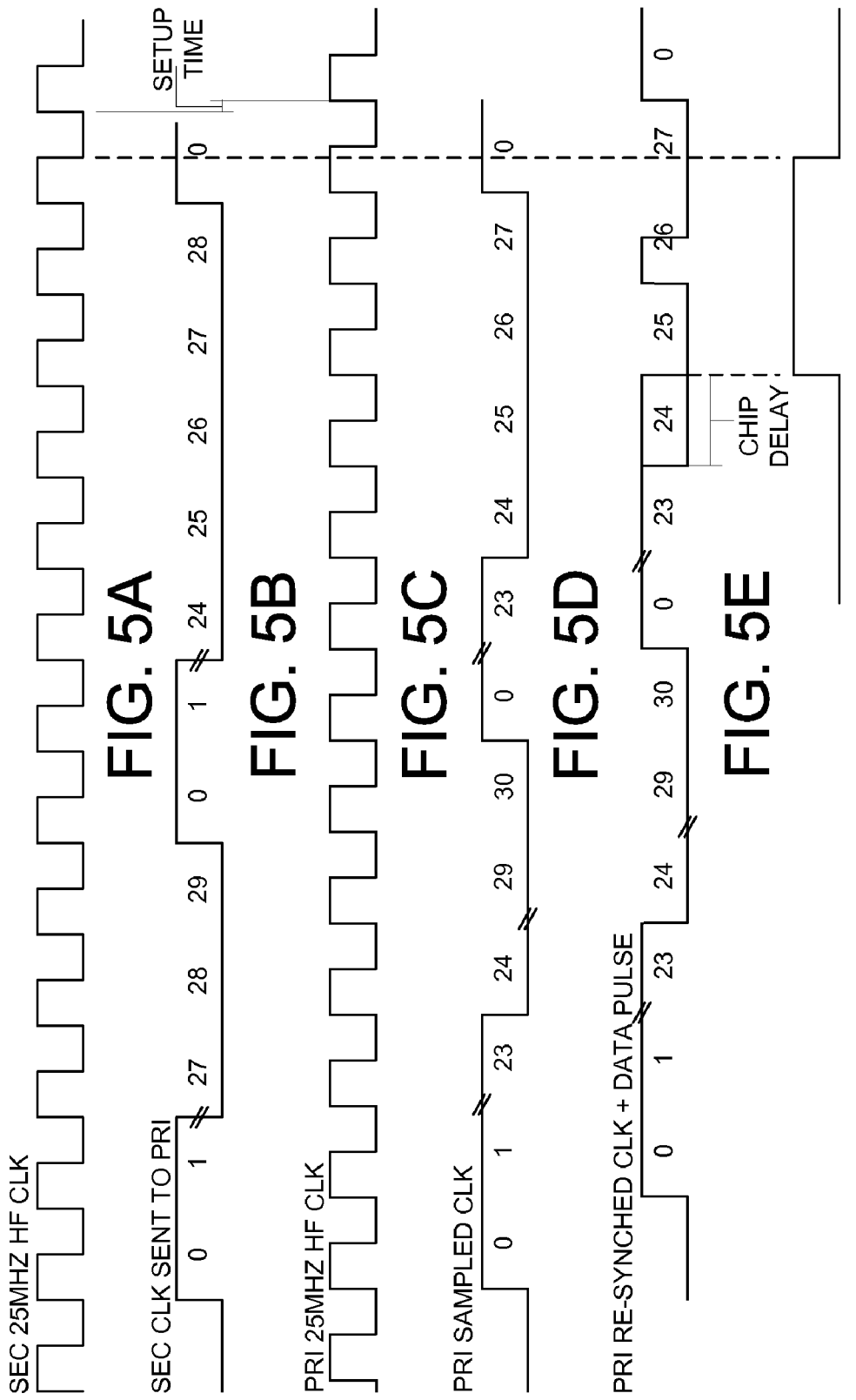

FREQUENCY MODULATION OF CLOCKS FOR EMI REDUCTION

BACKGROUND

Many electronic devices operate based on clock signals for timing various functions, for example using high frequency clock signals that are generated by an oscillator. The clock signals are ideally rectangular pulses with energy concentrated at a fundamental frequency and harmonics at the integer multiples of the fundamental frequency. Energy of the high frequency harmonics can be large enough to disturb functioning of other electronic devices through electromagnetic interference (EMI).

One technique for reducing electronic interference is to slightly vary the frequency of the clock signal, thereby spreading signal energy to a larger frequency band and reducing the contribution at any particular frequency to electromagnetic interference. The slight frequency variation can be attained through frequency or phase modulation wherein the reduction in EMI and the deviation of clock signal frequency depend on the amplitude, frequency and shape of the modulation signal.

SUMMARY

According to an embodiment of an electronic system, a frequency modulator manages clock signals for electromagnetic interference (EMI) reduction. The illustrative frequency modulator comprises a core oscillator, and a clock divider coupled to the core oscillator that modulates frequency of the core oscillator and deterministically spreads clock spectral components of a digital clock signal whereby electromagnetic interference (EMI) is reduced. The frequency modulator further comprises a circuit coupled to the clock divider that receives the digital clock signal, combines the digital clock signal with a data bitstream for transmission across an isolation barrier, and resynchronizes to the digital clock signal.

BRIEF DESCRIPTION OF THE DRAWINGS

Embodiments of the invention relating to both structure and method of operation may best be understood by referring to the following description and accompanying drawings:

FIG. 1B depicts Table I which illustrates selectable primary and secondary clock rates for operation of the clock divider;

FIG. 2C shows Table II, an illustration of performance for a fractional-N clock divider;

FIGS. 3A through 3D are flow charts showing one or more embodiments or aspects of a method for frequency modulation that enables EMI reduction;

FIGS. 4A and 4B are schematic time waveform graphs depicting multiplexed signals passing across the isolation barrier;

FIGS. 5A through 5F are schematic time waveform graphs illustrating timing signals in the secondary domain and the primary domain across the isolation barrier;

DETAILED DESCRIPTION

Figure 1A:
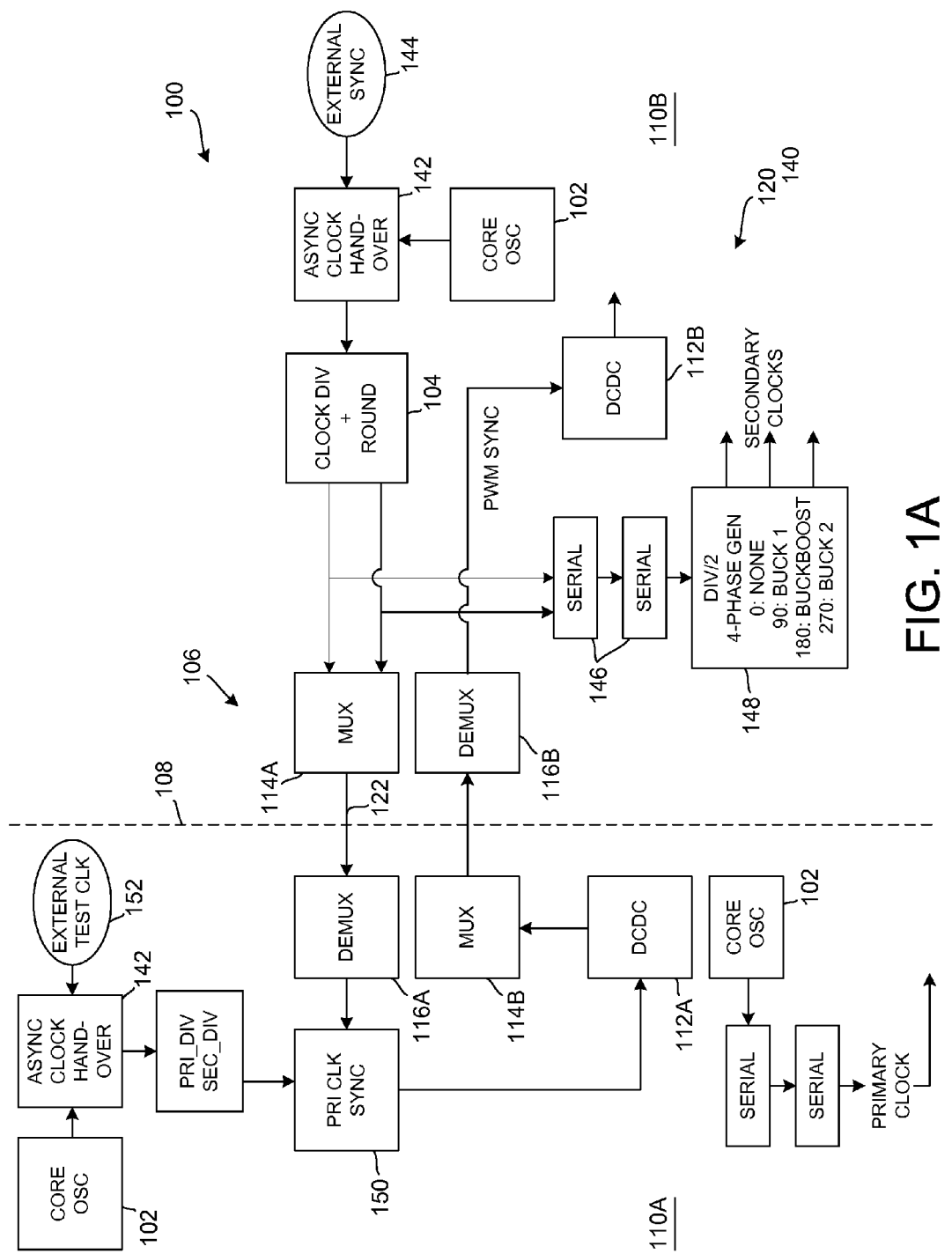
FIG. 1A is a schematic block diagram depicting an embodiment of a frequency modulator that manages clock signals for electromagnetic interference (EMI) reduction.

Referring to FIG. 1A, a schematic block diagram depicts an embodiment of a frequency modulator 100 that manages clock signals for electromagnetic interference (EMI) reduction. The illustrative frequency modulator 100 comprises a core oscillator 102, and a clock divider 104 coupled to the core oscillator 102 that modulates frequency of the core oscillator 102 and deterministically spreads clock spectral components of a digital clock signal whereby electromagnetic interference (EMI) is reduced. The frequency modulator 100 further comprises a circuit 106 coupled to the clock divider that receives the digital clock signal, combines the digital clock signal with a data bitstream for transmission across an isolation barrier 108, and resynchronizes to the digital clock signal.

In various embodiments, the clock divider 104 is configured to limit cycle-to-cycle jitter to one period of the core clock oscillator 102.

In an illustrative embodiment, the frequency modulator 100 can further comprise the isolation barrier 108 coupled to the clock divider 104 and the circuit 106 that separates the frequency modulator into first 110A and second 110B domains. A direct current (DC) to DC converter 112A is coupled to the first domain 110A and a DC to DC converter 112B is coupled to the second domain 110B. A phase generator 148 improves emissions by ensuring that first domain 110A and second domain 110B DC to DC converters 112A, 112B do not fire at the same time.

The frequency modulator 100 can further comprise a first multiplexer 114A coupled to the clock divider 104 in the second domain 110B and a first demultiplexer 116A in the first domain 110A coupled across the isolation barrier 108 to the first multiplexer 114A and coupled to the first DC to DC converter 112A in the first domain 110A. A second multiplexer 114B is coupled to the first DC to DC converter 112A in the first domain 110A. A second demultiplexer 116B in the second domain 110B is coupled across the isolation barrier 108 to the second multiplexer 114B and coupled to the second DC to DC converter 112B in the second domain 110B. The multiplexers 114A, 114B and demultiplexers 116A, 116B pass multiplexed clock and data signals across the isolation barrier 108.

In accordance with another embodiment of an electronic system, an electronic circuit 120 includes a frequency modulator 100 that manages clock signals for electromagnetic interference (EMI) reduction. The illustrative electronic circuit 120 comprises a transmission path 122 that includes an isolation barrier 108 and a frequency modulator 100 that modulates frequency of a digital clock signal and deterministically spreads clock spectral components of the digital clock signal. The electronic circuit 120 further comprises a multiplexer 114A and demultiplexer 116A coupled across the isolation barrier 108 for communicating the digital clock signal and a data signal on the transmission path 122. A circuit 106, including multiplexer 114A, demultiplexer 116A, and primary clock sync 150, receives the digital clock signal and the data signal on the transmission path 122 and synchronizes to the digital clock signal whereby electromagnetic interference (EMI) is reduced.

In the illustrative embodiment, the frequency modulator 100 comprises a core oscillator 102 and a clock divider 104 coupled to the core oscillator 102 that modulates frequency of the core oscillator 102 and deterministically spreads clock spectral components of a digital clock signal whereby electromagnetic interference (EMI) is reduced. The frequency modulator 100 further comprises the circuit 106 coupled to the clock divider 104 which is configured to receive the digital clock signal and synchronize to the digital clock signal.

The electronic circuit 120 can further comprise the isolation barrier 108 coupled between a clock divider 104 and the circuit 106 which separates the frequency modulator 100 into first 110A and second 110B domains. A DC to DC converter 112A is coupled to the first domain 110A and a DC to DC converter 112B is coupled to the second domain 110B. The first domain 110A and second domain 110B DC to DC converters 112A, 112B are prevented from firing simultaneously by the phase generator 148, thereby improving emissions.

The electronic circuit 120 can further comprise a first multiplexer 114A coupled to the clock divider 104 in the second domain 110B and a first demultiplexer 116A in the first domain 110A coupled across the isolation barrier 108 to the first multiplexer 114A and coupled to the first DC to DC converter 112A in the first domain 110A. A second multiplexer 114B is coupled to the first DC to DC converter 112A in the first domain 110A. A second demultiplexer 116B in the second domain 110B is coupled across the isolation barrier 108 to the second multiplexer 114B and coupled to the second DC to DC converter 112B in the second domain 110B. The multiplexers 114A, 114B and demultiplexers 116A, 116B pass multiplexed clock and data signals across the isolation barrier 108.

In accordance with a further embodiment of an electronic system, an electronic circuit 140 facilitates electromagnetic interference (EMI) reduction. The depicted electronic circuit 140 comprises a transmission path 122 and a frequency modulator 100 that modulates frequency of a digital clock signal and deterministically spreads clock spectral components of the digital clock signal. The electronic circuit 140 further comprises a multiplexer 114A and demultiplexer 116A coupled by the transmission path 122 that communicate the digital clock signal and a data signal on the transmission path 122. A circuit 106 receives the digital clock signal and the data signal on the transmission path 122 and synchronizes to the digital clock signal so that electromagnetic interference (EMI) is reduced.

As depicted in FIG. 1A, the core oscillator 102 in the second domain 110B or secondary side of the electronic circuit 140 is applied to an asynchronous clock handover 142, which is also connected to receive an external sync 144. The asynchronous clock handover 142 passes the secondary side core clock signal to the clock divider 104, which creates a primary clock*2 and a secondary clock*2 on the secondary side 110B. In an example implementation, the clock divider 104 can have selectable settings to attain a desired clock rate. For example, at a core oscillator 102 at 25 MHz, Table I is shown in FIG. 1B and illustrates primary and secondary clock rates. The primary (priclk*2) clock signal is applied to the multiplexer 114A for passage across the isolation barrier 108. The multiplexer 114A combines a modulated clock signal and a data bitstream for message passing over the isolation barrier 108 by dividing the primary clock by two so that every other pulse encodes data. The multiplexed signal is passed over the isolation barrier 108 and resampled, for example with up to 40 nanoseconds of jitter. In an illustrative embodiment, the phase generator 104 sends a phase-0 signal through the serial blocks 146 to the phase generator 148. The phase generator 148 includes a four-phase generator which divides the secondary clock by two with phases starting on rising and falling edges. The phase 0 clock signal from the clock divider 104 is synchronized between the primary and secondary clocks by starting a serial message on a phase 0 clock edge. The secondary clock and phase 0 signals are passed through serial blocks 146 to a phase generator 148, all in the secondary domain 110B. The phase generator 148 includes divide by two and divide by four phase generation to resynchronize the secondary clock signals.

The multiplexed signal is passed over the isolation barrier 108 to a demultiplexer 116A on the primary side 110A, which operates as an effective divide by two, and passes the demultiplexed signal to a primary clock synchronization block 150. The primary clock synchronization block 150 synchronizes the demultiplexed signal to the core clock signal on the primary side 110A. The primary side 110A also has a core oscillator 102 which is independent of the core oscillator on the secondary side 110B. The core clock signal from the primary side core oscillator 102 is passed to an asynchronous clock handover block 142 on the primary side which modifies the clock signal according to an external test clock 152. The primary clock synchronization block 150 passes a dcdc clock signal, in an example implementation with 80% pulse width modulation to the DC to DC converter 112A on the first domain or primary side 110A. The DC to DC converter 112A passes an inverted Nsync signal to a multiplexer 114B in the primary or first domain 110A, which inserts a data pulse onto the Nsync clock signal and passes the multiplexed signal back across the isolation barrier 108 to a demultiplexer 116B in the secondary or second domain 110B. The demultiplexer 116B passes the inverted Nsync signal to the secondary side 110B. The signal communication is a synchronous transfer in which the demultiplexer 116B on the secondary side 110B is operating in synchrony so that the position of the data pulse on the return multiplexed signal is known.

In accordance with an embodiment of an electronic circuit, a digital clock signal and data are multiplexed over an isolation barrier 108. The illustrative electronic circuit comprises an isolation barrier 108, a transmission path 122, and a core oscillator 102. A clock divider 104 coupled to the core oscillator 102 generates a digital clock signal. A multiplexer 114A and demultiplexer 116A are coupled by the transmission path 122 that communicate the digital clock signal and a data signal on the transmission path 122. A circuit 106 coupled to the clock divider 104 receives the digital clock signal, combines the digital clock signal with a data bitstream for transmission across an isolation barrier 108, and resynchronizes to the digital clock signal.

Figure 2A:
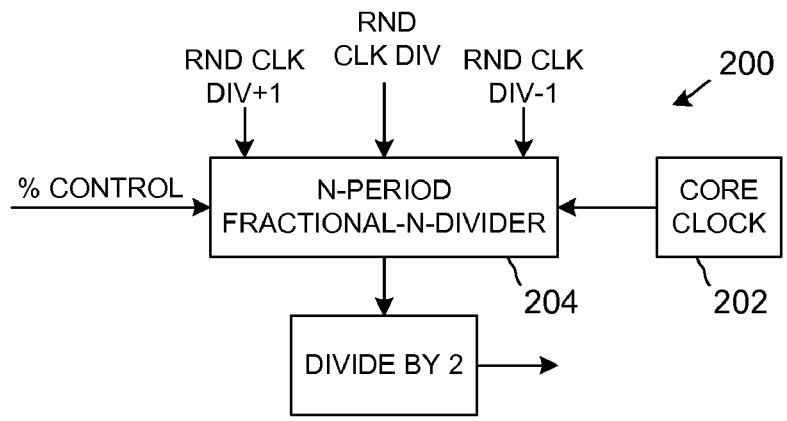
FIGS. 2A and 2B respectively show a schematic block diagram and an associated time waveform for an embodiment of a portion of the frequency modulator and a signal waveform produced by the frequency modulator.
Figure 2B:
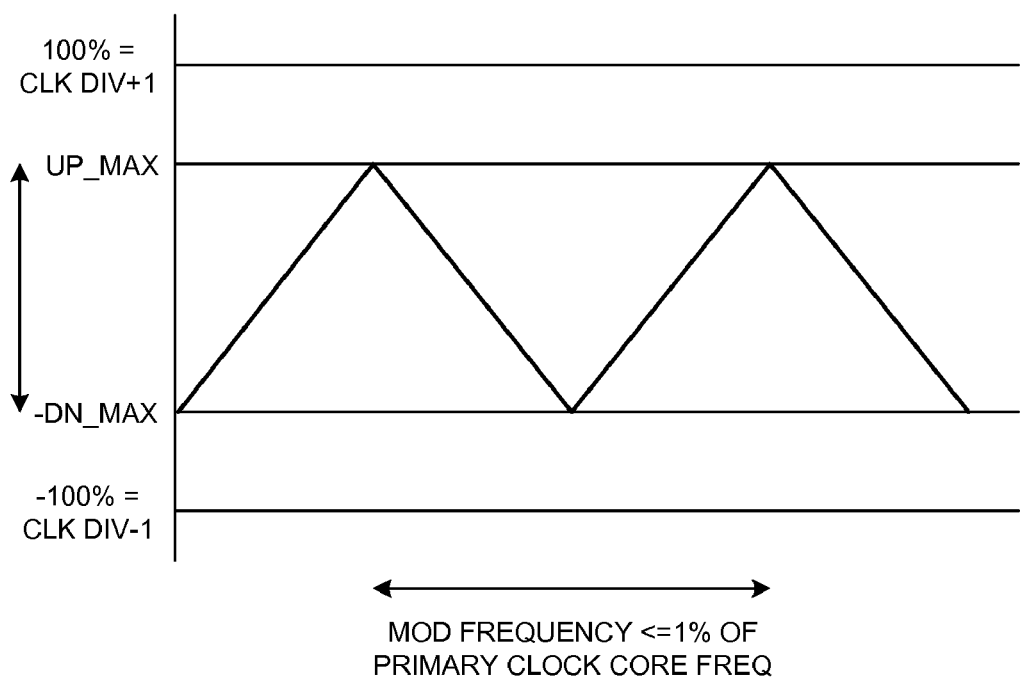

Referring to FIGS. 2A and 2B, a schematic block diagram and an associated time waveform respectively illustrate an embodiment of a portion of the frequency modulator 200 and a signal waveform produced by the frequency modulator. The frequency modulator 200 includes a clock divider 204 comprising an N-period fractional-N divider driven with a triangle wave that controls spreading and modulation rate and alternates between a division ratio, the division ratio minus 1, and the division ratio plus 1 in proportion to the triangle wave.

The N-period fractional-n clock divider 204 is driven with the triangle wave to modulate a fractional-n ratio setting from a nominal up to divider+1, back to nominal, down to divider−1, and back to nominal. The fractional-n divider 204 creates a sequence that alternates between two dividers evenly according to a ratio specified by a percent control setting.

In an example implementation, the fractional-N divider 204 can operate at a core oscillator 202 at 25 MHz in accordance with Table II, shown in FIG. 2C. The fractional-N divider 204 is not retimed with a phase-locked loop so that up to about 40 nanoseconds of clock jitter can result. In some configurations, pseudo-random binary sequence (PRBS) modulation can be used. At a modulation rate of 1% of the primary dcdc clock frequency, the primary clock does not jitter more than one 40 ns core clock period in either direction cycle-to-cycle as long as the fractional-N period is sufficiently long, thereby facilitating communication across the isolation barrier in either direction.

Figure 3A:
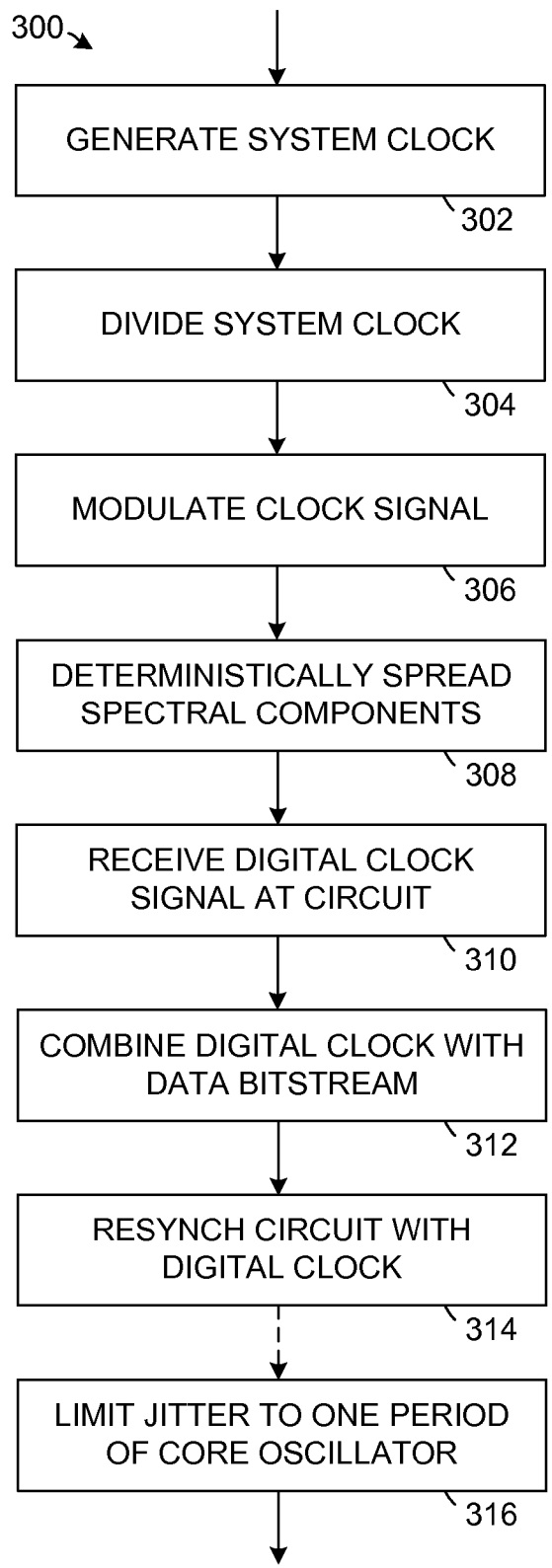

FIGS. 3A through 3D are flow charts showing one or more embodiments or aspects of a method for frequency modulation that enables EMI reduction. Referring to FIG. 3A, a frequency modulation method 300 comprises generating 302 a system clock signal and dividing 304 the system clock signal whereby the clock signal is modulated 306 and clock spectral components are deterministically spread 308 in a digital clock signal. The digital clock signal is received 310 at a circuit and the digital clock signal is combined 312 with a data bitstream for transmission across an isolation barrier. Circuit operation is resynchronized 314 to the digital clock signal whereby electromagnetic interference (EMI) is reduced.

In various implementations, cycle-to-cycle jitter in the digital clock signal can be limited 316 to one period of the core clock oscillator.

Figure 3B:
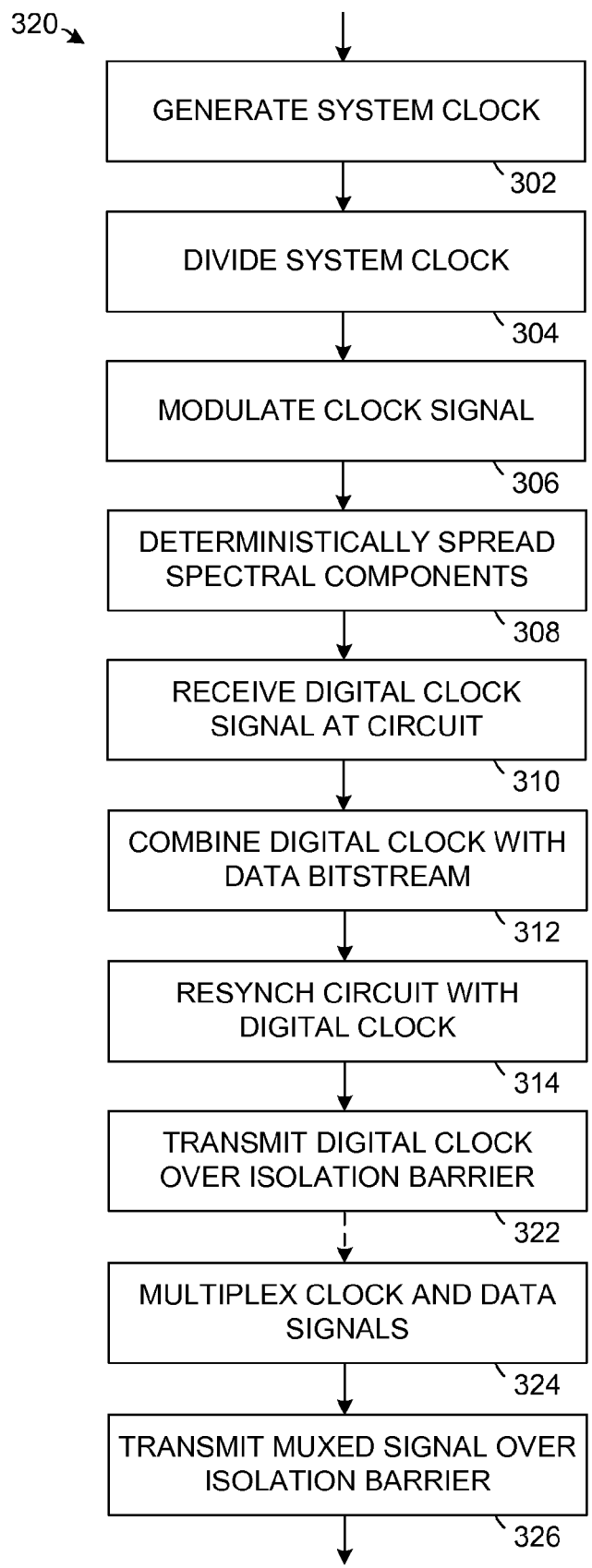

Referring to FIG. 3B, a frequency modulation method 320 can further comprise transmitting 322 the digital clock signal over an isolation barrier. The method 320 can further comprise multiplexing 324 the digital clock signal and a data signal, and transmitting 326 the multiplexed digital clock and the data signal over the isolation barrier.

Referring to FIG. 3C, in some embodiments a method for frequency modulation 330 can comprise dividing 332 the system clock signal in an N-period fractional-n division, driving 334 the clock signal division with a triangle wave, and controlling 336 frequency spreading and modulation rate. A fractional-n ratio setting is modulated 338 from a nominal up to divider+1, back to nominal, down to divider−1, and back to nominal. The fractional-n modulation creates 340 a sequence that alternates between two dividers evenly according to a ratio specified by a percent control setting.

Referring to FIG. 3D, in some embodiments a method for frequency modulation 350 can comprise dividing 352 the system clock signal in a pseudo-random division, controlling 354 frequency spectral spreading by changing division ratio between two selected ratios from cycle to cycle, and alternating 356 between a nominal divide ratio, and either the divide ratio plus 1 or the divide ratio minus 1.

Referring to FIGS. 4A and 4B, schematic time waveform graphs are depicted for multiplexed signals that pass across the isolation barrier respectively showing signals passing from the secondary side to the primary side, and signals passing from the primary side to the secondary side. The clock signal shown in FIG. 4A which passes from the secondary side to the primary side is two times the primary side clock speed. Every other pulse is data. In an illustrative implementation, clock recovery circuitry on the secondary side assumes a 25% duty cycle with circuitry monitoring for a second rising edge over the next 50% period of the duty cycle. Presence of the second rising edge indicates a data 1 condition.

As shown in FIG. 4B, an nsync signal sent back across the isolation barrier from the primary side to the secondary side is synchronous to the primary clock signal with up to 100 ns delay. Data is sent from the primary side to the secondary side by inserting short pulses in a 20% down period of a pulse width modulator (PWM) sync signal. The data pulses are masked on the secondary side and nsync is created exactly with a few nanoseconds of logic delay. In an illustrative implementation, the primary side generates an 80% duty cycle clock to send to the DCDC converter. The 80% amount is estimated based on the length of the previous clock cycle. Data is sent from the primary side to the secondary side by hiding a small pulse in a "low" section of a DCDC PWM sync signal. The secondary side has sufficient information to locate the "low" section in the waveform since a guaranteed relationship exists between the sync pulse and the clock sent by the primary side, enabling the secondary side to mask the signal.

Referring to FIGS. 5A through 5F, schematic time waveform graphs illustrate timing signals in the secondary domain and the primary domain across the isolation barrier. FIG. 5A shows an example of a secondary domain core clock signal, in the illustrative configuration a 25 MHz high frequency clock. FIG. 5B depicts the secondary clock sent across the isolation barrier to the primary domain. Every divided clock period from the secondary domain can shift one 40 ns period faster or slower due to clock spreading. FIG. 5C shows the primary domain core clock signal, again a 25 MHz clock. FIG. 5D illustrates the primary domain sampled clock signal. FIG. 5E shows the primary domain resynchronized clock with inserted data pulse. With a clock period of 30 cycles, the 80% point is positioned after the $23^{rd}$ cycle. The 80% location is approximated using the previous clock period. In the illustrative case, the 80% location is too late as shown in cycle 26. A worst case occurs when the primary domain circuit overestimates the 80% mark, based on the previous clock period. A long period is followed by a short period, exacerbated by possible clock retiming jitter if edges are too close to alignment. FIG. 5F depicts the secondary domain receiving mask. The mask begins on the falling edge with pulse width modulation off, and ends one-half clock cycle after sending the next clock rising edge.

Figure 6:
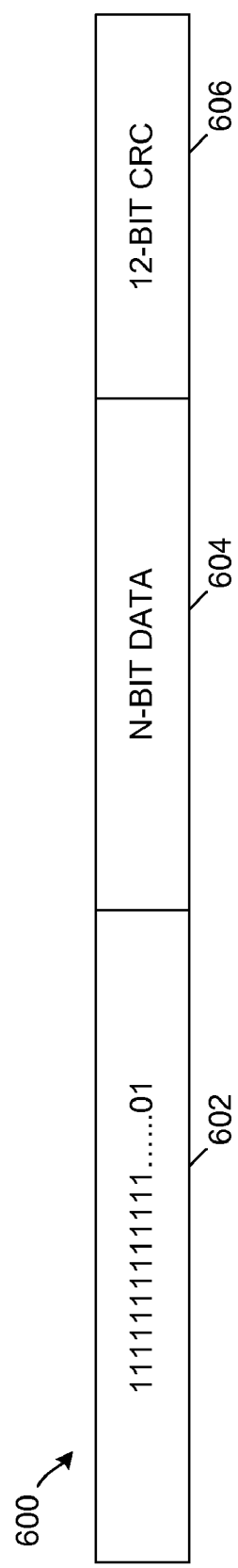
FIG. 6 is a data structure diagram showing an isolator serial frame format that is suitable for usage with the illustrative timing element embodiments.

Referring to FIG. 6, a data structure diagram shows an isolator serial frame format 600 that is suitable for usage with the illustrative timing element embodiments. A Management Data Input/Output (MDIO)-style frame sync sequence 602 includes M+2 1's followed by a "01" start signal, ensuring the sequence cannot occur inside a frame. The isolator serial frame format further includes an N-bit data field 604 and a 12-bit Cyclic Redundancy Check (CRC) code 606, forming a message length M=N+12.

The 12-bit CRC can detect any 12-bit error burst. Isolator events can last 10 μs which, at a clock speed of 1 MHz, forms 10 bits. The 12-bit CRC can also detect any four random bit flips, a very unlikely occurrence. The CRC register can be initialized to a non-zero value so that an all-zero message fails. The 12-bit CRC can be implemented using a standard CRC-12 polynomial.

Additional protection can be implemented through usage of a detect frame sync and frame sync of the next message to validate frame length, thereby avoiding frame slip errors. Glitch filtering can be implemented for bits which originate from a slave serial interface, which is less protected.

Figure 7:
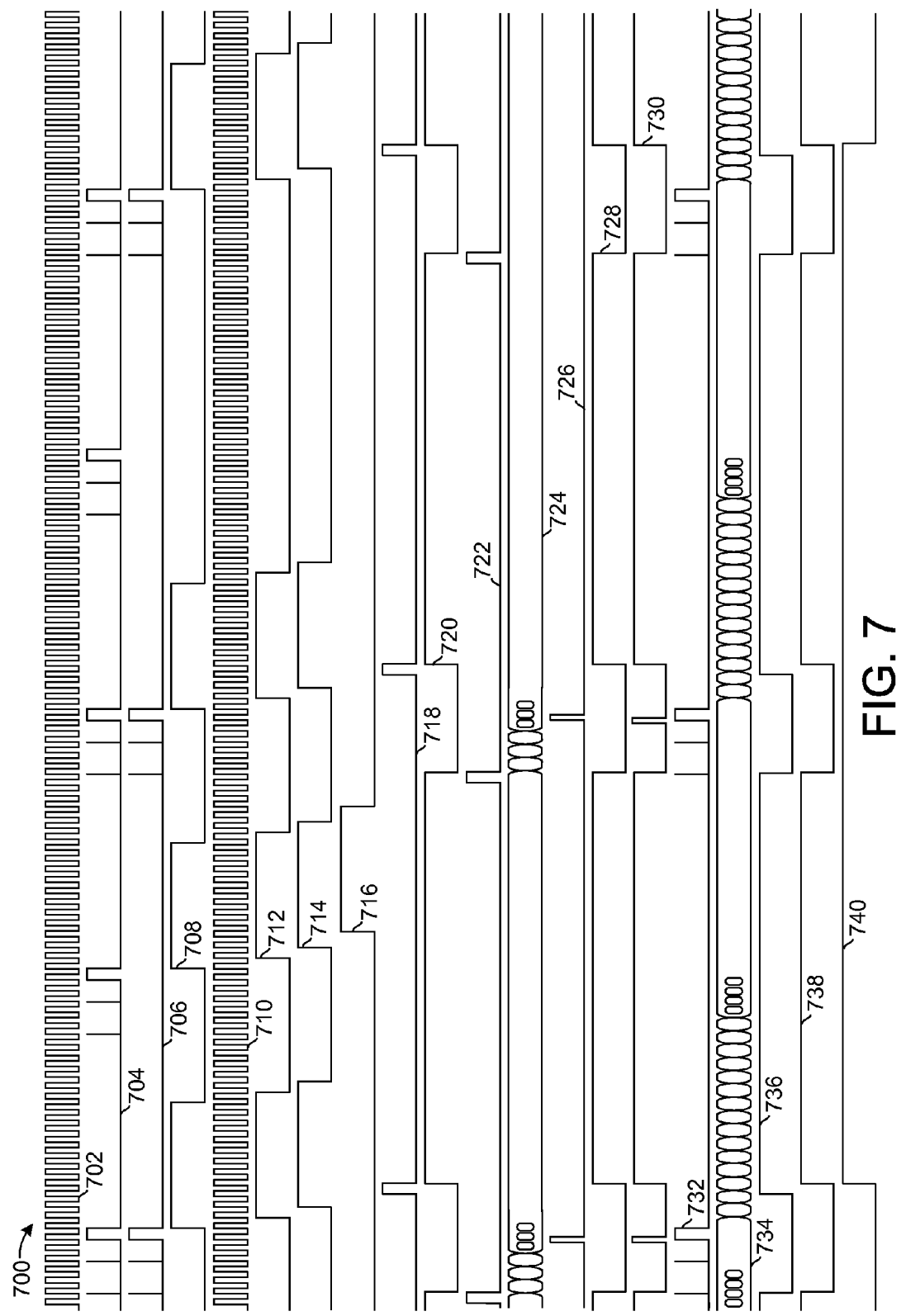
FIG. 7 is a schematic time waveform graph illustrating timing signals in an example of operation of the illustrative timing element embodiments.

Referring to FIG. 7, a schematic time waveform graph illustrates timing signals in an example of operation of the illustrative timing element embodiments. Isolator communication timing signals 700 include a core clock signal 702 generated by the core oscillator in the secondary domain that is applied to the secondary domain clock divider. The clock divider produces a divided clock rise enable signal 704 which is passed to the secondary side multiplexer. The secondary side multiplexer produces an enable signal 706 for the clock pulse of multiplexed signal 708. The multiplexed signal 708 passes through the isolation barrier and enables communication of the multiplexed timing signal 706 across the isolation barrier. The primary domain core oscillator produces a primary domain core clock signal 710. A demultiplexer sync signal 712 and demultiplexer sample signal 714 are shown which are applied to the demultiplexer on the primary side to generate a demultiplexer data output signal 716. The demultiplexer clock rise enable 718 is applied to the primary clock sync element to generate a DCDC clock 720. An estimated 80% duty cycle signal 722 triggers the falling edge of the DCDC clock signal 720 and also starts a counter which times the data pulse insertion. Counter 724 for data pulse insertion is applied to the multiplexer on the primary side to generate the data pulse 726. An inverted nsync signal 728 is passed from the DCDC converter to the primary side multiplexer. A multiplexer output signal 730 is transmitted across the isolation barrier and enables communication of nsync 728 across the isolation barrier from the primary side to the secondary side. The multiplexer output signal 726 is passed across the isolation barrier to the secondary side and demultiplexed by the secondary side demultiplexer which demultiplexes the signal according to a demultiplexer primary side clock enable 732, a demultiplexer counter 734, and a demultiplexer data mask 736, to generate a secondary side nsync 738 and a secondary side demultiplexer data output signal 740.

Figure 8A:
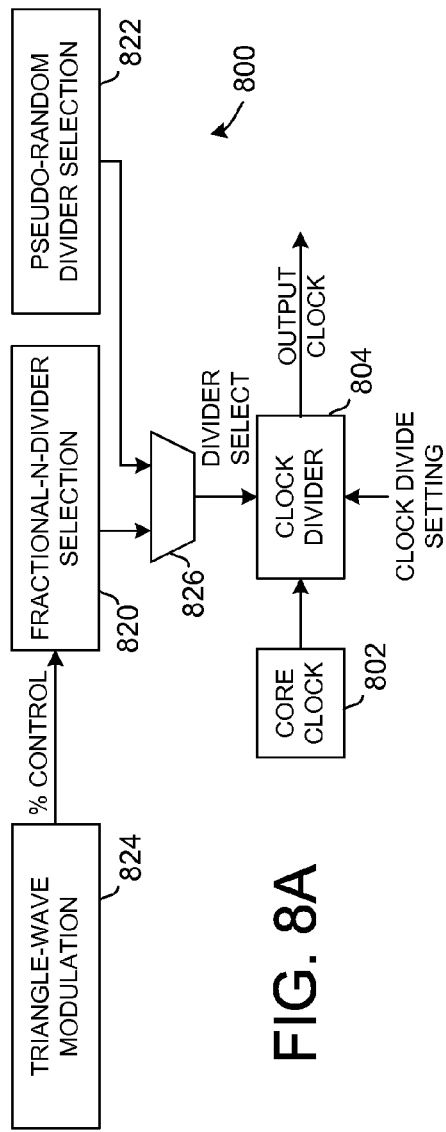
FIGS. 8A and 8B are a schematic block diagram and a time waveform graph showing operation of a programmable clock modulation system for programmable control of timing and/or performance testing of clocking techniques.
Figure 8B:
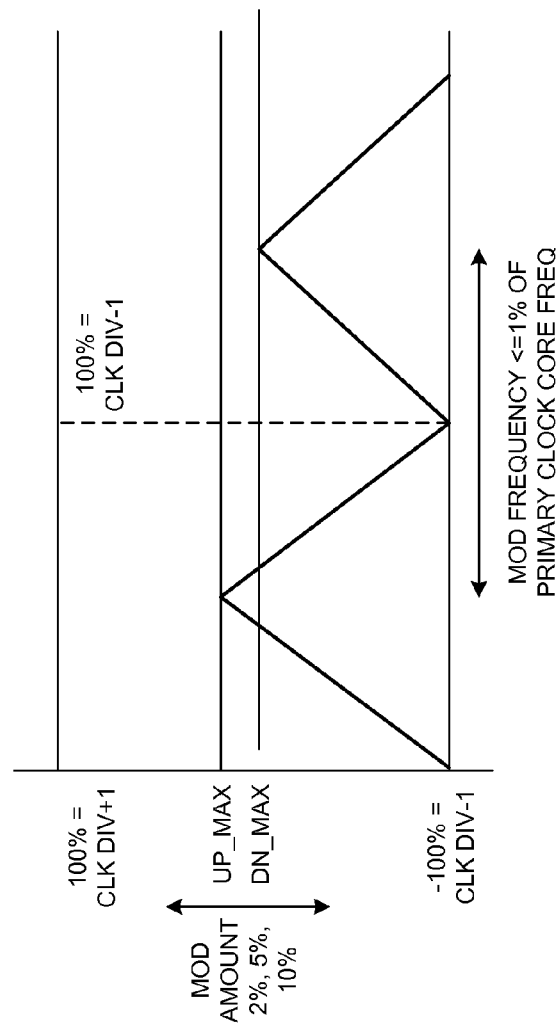

Referring to FIGS. 8A and 8B, a schematic block diagram and a time waveform respectively illustrate a further embodiment of a frequency modulator 800 and a signal waveform produced by the frequency modulator. The clock divider 804 comprising a pseudo-random divider that controls frequency spectral spreading by changing division ratio between two selected ratios from cycle to cycle.

The pseudo-random clock divider creates a sequence alternating between a nominal divide ratio, and either the divide ratio plus 1 or the divide ratio minus 1.

Referring to FIGS. 8A and 8B, a schematic block diagram and a time waveform graph illustrate operation of a programmable clock modulation system 800 for programmable control of timing and/or performance testing of clocking techniques. As shown in FIG. 8A, a clock modulation system 800 enables programming of fractional-N divider selection 820 and pseudo-random divider selection 822. The fractional-N divider 820 creates a sequence that alternates between two dividers evenly according to a ratio specified by a percentage control. Triangle-wave modulation 824 drives percentage control of the fractional-N divider 820. The pseudo-random selector 822 creates a sequence that alternates between the nominal divide ratio and either divider+1 and divider−1. Control signals from the fractional-N divider selection 820 and the pseudo-random divider selection 822 are applied to a multiplexer 826 that enables a user to select between the two types of modulation. The multiplexer 826 can be optional to an implementation. A divider select signal from the multiplexer 826 is applied to a clock divider 804 which receives a core clock signal from a core oscillator 802 and generates an output clock signal based on the divider select signal and a clock divide setting. The output clock signal can be used directly and not fed to a phase-locked loop (PLL) to smooth the modulation frequency. Typical implementations of a fractional-N divider use a PLL. The system 800 can further include logic to regulate the rate of modulation according to user settings and create two output clock signals with fundamental modulation operation remaining the same.

Figure 9A:
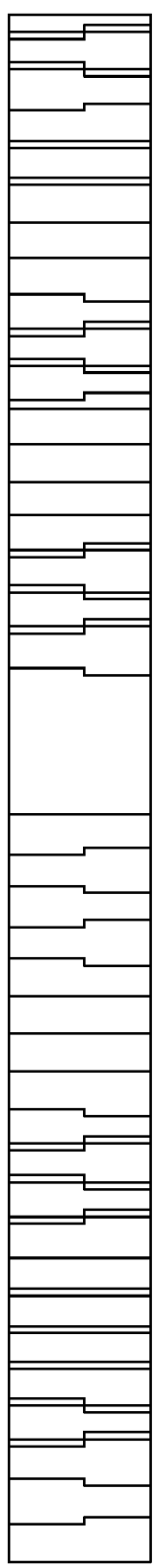
FIGS. 9A, 9B, and 9C are time waveform graphs showing performance of various clock spreading methods for timing circuits.
Figure 9B:
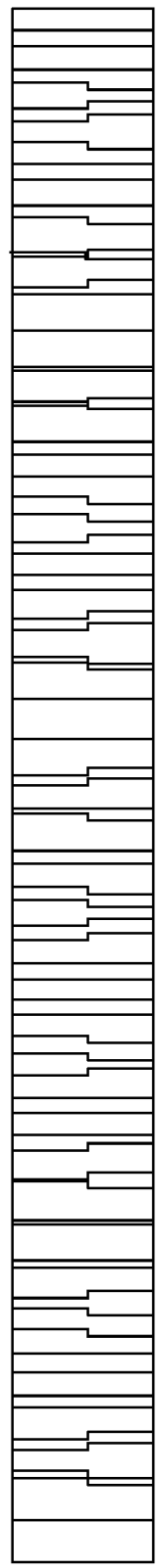
Figure 9C:
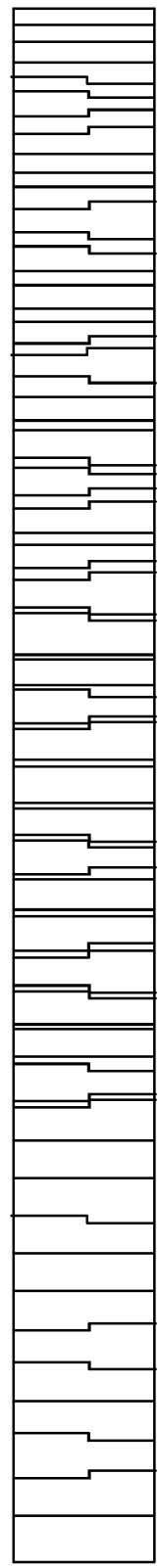

Referring to FIGS. 9A, 9B, and 9C, time waveform graphs illustrate performance of various clock spreading methods for timing circuits. FIG. 9A shows results of a clock spreading technique in which a fixed amount delay is randomly or pseudo-randomly inserted into the clock signal applied to the divider. The technique enables control of the amount of spreading but not the rate of modulation. No phase drift results from the technique.

FIG. 9B illustrates a pseudorandom technique in which the clock division ratio pseudo-randomly changes from cycle to cycle. The amount of spreading can be controlled but not the rate of modulation. The technique results in phase drifts in a random-walk manner.

FIG. 9C depicts a fractional-N technique in which division ratio changes according to a fractional-N divider driven with a triangle wave. The technique enables control of both the amount of spreading and the rate of modulation. Phase drifts occur that reflect triangle-wave variation.

Terms "substantially", "essentially", or "approximately", that may be used herein, relate to an industry-accepted tolerance to the corresponding term. Such an industry-accepted tolerance ranges from less than one percent to twenty percent and corresponds to, but is not limited to, component values, integrated circuit process variations, temperature variations, rise and fall times, and/or thermal noise. The term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. Inferred coupling, for example where one element is coupled to another element by inference, includes direct and indirect coupling between two elements in the same manner as "coupled".

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, various aspects or portions of a network interface are described including several optional implementations for particular portions. Any suitable combination or permutation of the disclosed designs may be implemented.

What is claimed is:
1. A frequency modulator comprising:
a core oscillator;
a clock divider coupled to the core oscillator that modulates frequency of the core oscillator and deterministically spreads clock spectral components of a digital clock signal whereby electromagnetic interference (EMI) is reduced; and a circuit coupled to the clock divider that receives the digital clock signal, combines the digital clock signal with a data bitstream for transmission across an isolation barrier configured to isolate between first and second domains of the frequency modulator, and resynchronizes to the digital clock signal.

2. The frequency modulator according to claim 1 further comprising:
the clock divider comprising an N-period fractional-n divider driven with a triangle wave that controls spreading and modulation rate and alternates between a division ratio, the division ratio minus 1, and the division ratio plus 1 in proportion to the triangle wave.

3. The frequency modulator according to claim 1 further comprising:
the clock divider comprising an N-period fractional-n divider driven with a triangle wave that modulates a fractional-n ratio setting from a nominal up to divider+1, back to nominal, down to divider−1, and back to nominal, the fractional-n divider creating a sequence that alternates between two dividers evenly according to a ratio specified by a percent control setting.

4. The frequency modulator according to claim 1 further comprising:
the clock divider comprising a pseudo-random divider that controls frequency spectral spreading by changing division ratio between two selected ratios from cycle to cycle.

5. The frequency modulator according to claim 1 further comprising:
the clock divider comprising a pseudo-random divider that creates a sequence alternating between a nominal divide ratio, and either the divide ratio plus 1 or the divide ratio minus 1.

6. The frequency modulator according to claim 1 further comprising:
the clock divider configured to limit cycle-to-cycle jitter to one period of the core clock oscillator.

7. The frequency modulator according to claim 1 further comprising:
the isolation barrier coupled between the clock divider and the circuit and separating and isolating the frequency modulator into the first and second domains;
a direct current (DC) to DC converter coupled to the first domain; and
a DC to DC converter coupled to the second domain, the first domain and second domain DC to DC converters synchronized by the digital clock signal whereby electromagnetic interference (EMI) is reduced and analog asynchronous delays are prevented.

8. The frequency modulator according to claim 7 further comprising:
a first multiplexer coupled to the clock divider in the second domain;
a first demultiplexer in the first domain coupled across the isolation barrier to the first multiplexer and coupled to the first DC to DC converter in the first domain;
a second multiplexer coupled to the first DC to DC converter in the first domain; and
a second demultiplexer in the second domain coupled across the isolation barrier to the second multiplexer and coupled to the second DC to DC converter in the second domain, the multiplexers and demultiplexers passing multiplexed clock and data signals across the isolation barrier.

9. A frequency modulation method comprising:
generating a system clock signal;
dividing the system clock signal whereby the clock signal is modulated and clock spectral components are deterministically spread in a digital clock signal;
receiving the digital clock signal at a circuit;
combining the digital clock signal with a data bitstream for transmission across an isolation barrier configured to isolate between first and second frequency modulation domains; and
resynchronizing circuit operation to the digital clock signal whereby electromagnetic interference (EMI) is reduced.

10. The method according to claim 9 further comprising:
dividing the system clock signal in an N-period fractional-n division;
driving the clock signal division with a triangle wave;
controlling frequency spreading and modulation rate; and
modulating a fractional-n ratio setting from a nominal up to divider+1, back to nominal, down to divider−1, and back to nominal, the fractional-n modulation creating a sequence that alternates between two dividers evenly according to a ratio specified by a percent control setting.

11. The method according to claim 9 further comprising:
dividing the system clock signal in a pseudo-random division;
controlling frequency spectral spreading by changing division ratio between two selected ratios from cycle to cycle; and
alternating between a nominal divide ratio, and either the divide ratio plus 1 or the divide ratio minus 1.

12. The method according to claim 9 further comprising:
limiting cycle-to-cycle jitter in the digital clock signal to one period of the core clock oscillator.

13. The method according to claim 9 further comprising:
transmitting the digital clock signal over an isolation barrier;
multiplexing the digital clock signal and a data signal;
transmitting the multiplexed digital clock and the data signal over the isolation barrier.

14. An electronic circuit comprising:
a transmission path comprising an isolation barrier configured to isolate between first and second domains of the electronic circuit;
a frequency modulator that modulates frequency of a digital clock signal and deterministically spreads clock spectral components of the digital clock signal;
a multiplexer and demultiplexer coupled across the isolation barrier for communicating the digital clock signal and a data signal on the transmission path; and
a circuit that receives the digital clock signal and the data signal on the transmission path and synchronizes to the digital clock signal whereby electromagnetic interference (EMI) is reduced.

15. The electronic circuit according to claim 14 comprising:
the frequency modulator comprising:
a core oscillator;
a clock divider coupled to the core oscillator that modulates frequency of the core oscillator and deterministically spreads clock spectral components of a digital clock signal whereby electromagnetic interference (EMI) is reduced; and
the circuit coupled to the clock divider configured to receive the digital clock signal and synchronize to the digital clock signal.

16. The electronic circuit according to claim 14 further comprising:
the frequency modulator comprising an N-period fractional-n divider driven with a triangle wave that controls spreading and modulation rate and alternates between a division ratio, the division ratio minus 1, and the division ratio plus 1 in proportion to the triangle wave.

17. The electronic circuit according to claim 14 further comprising:
the frequency modulator comprising an N-period fractional-n divider driven with a triangle wave that modulates a fractional-n ratio setting from a nominal up to divider+1, back to nominal, down to divider−1, and back to nominal, the fractional-n divider creating a sequence that alternates between two dividers evenly according to a ratio specified by a percent control setting.

18. The electronic circuit according to claim 14 further comprising:
the frequency modulator comprising a pseudo-random divider that controls frequency spectral spreading by changing division ratio between two selected ratios from cycle to cycle.

19. The electronic circuit according to claim 14 further comprising:
the frequency modulator comprising a pseudo-random divider that creates a sequence alternating between a nominal divide ratio, and either the divide ratio plus 1 or the divide ratio minus 1.

20. The electronic circuit according to claim 14 further comprising:
the frequency modulator configured to limit cycle-to-cycle jitter of the digital clock signal to one period of the core clock oscillator.

21. The electronic circuit according to claim 14 further comprising:
the isolation barrier coupled between a clock divider and the circuit and separating and isolating the frequency modulator into the first and second domains;
a direct current (DC) to DC converter coupled to the first domain; and
a DC to DC converter coupled to the second domain, the first domain and second domain DC to DC converters synchronized by the digital clock signal whereby electromagnetic interference (EMI) is reduced.

22. The electronic circuit according to claim 21 further comprising:
a first multiplexer coupled to the clock divider in the second domain;
a first demultiplexer in the first domain coupled across the isolation barrier to the first multiplexer and coupled to the first domain DC to DC converter;
a second multiplexer coupled to the first domain DC to DC converter in the first domain; and
a second demultiplexer in the second domain coupled across the isolation barrier to the second multiplexer and coupled to the second domain DC to DC converter, the multiplexers and demultiplexers passing multiplexed clock and data signals across the isolation barrier.

23. An electronic circuit comprising:
a transmission path;
a frequency modulator that modulates frequency of a digital clock signal and deterministically spreads clock spectral components of the digital clock signal;
a multiplexer and demultiplexer coupled by the transmission path that communicate the digital clock signal and a data signal on the transmission path; and
a circuit that receives the digital clock signal and the data signal on the transmission path and synchronizes to the digital clock signal whereby electromagnetic interference (EMI) is reduced.

24. An electronic circuit comprising:
an isolation barrier configured to isolate between first and second domains of the electronic circuit;
a transmission path across the isolation barrier;
a core oscillator;
a clock divider coupled to the core oscillator that generates a digital clock signal;
a multiplexer and demultiplexer coupled by the transmission path that communicate the digital clock signal and a data signal on the transmission path; and
a circuit coupled to the clock divider that receives the digital clock signal, combines the digital clock signal with a data bitstream for transmission across an isolation barrier, and resynchronizes to the digital clock signal.

25. The electronic circuit according to claim 24 further comprising:
the isolation barrier coupled between the clock divider and the circuit and separating and isolating the electronic into the first and second domains;
a direct current (DC) to DC converter coupled to the first domain;
a DC to DC converter coupled to the second domain, the first domain and second domain DC to DC converters synchronized by the digital clock signal whereby electromagnetic interference (EMI) is reduced and analog asynchronous delays are prevented;
a first multiplexer coupled to the clock divider in the second domain;
a first demultiplexer in the first domain coupled across the isolation barrier to the first multiplexer and coupled to the first DC to DC converter in the first domain;
a second multiplexer coupled to the first DC to DC converter in the first domain; and
a second demultiplexer in the second domain coupled across the isolation barrier to the second multiplexer and coupled to the second DC to DC converter in the second domain, the multiplexers and demultiplexers passing multiplexed clock and data signals across the isolation barrier.

* * * * *